(12) United States Patent
Chen et al.

(10) Patent No.: US 7,923,817 B2
(45) Date of Patent: Apr. 12, 2011

(54) CAPACITOR PAIRS WITH IMPROVED MISMATCH PERFORMANCE

(75) Inventors: Chia-Yi Chen, Hsinchu (TW);
Chung-Long Chang, Dou-Liu (TW);
Chih-Ping Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 12/463,949

(22) Filed: May 11, 2009

(65) Prior Publication Data

US 2009/0212392 A1   Aug. 27, 2009

Related U.S. Application Data

(62) Division of application No. 11/591,644, filed on Nov. 1, 2006, now Pat. No. 7,545,022.

(51) Int. Cl.
*H01L 29/00* (2006.01)

(52) U.S. Cl. .................. 257/532; 257/307; 257/E27.048

(58) Field of Classification Search .................. 257/532, 257/307, E27.048
See application file for complete search history.

(56) References Cited

U.S. PATENT DOCUMENTS

| | | | |
|---|---|---|---|
| 7,545,022 B2* | 6/2009 | Chen et al. | ..................... 257/532 |
| 2003/0183864 A1 | 10/2003 | Miyazawa | |
| 2004/0031982 A1 | 2/2004 | Devries et al. | |
| 2007/0001203 A1 | 1/2007 | Lehr et al. | |
| 2008/0012092 A1* | 1/2008 | Liang et al. | ..................... 257/532 |
| 2008/0099879 A1 | 5/2008 | Chen et al. | |

* cited by examiner

*Primary Examiner* — Tan N Tran
(74) *Attorney, Agent, or Firm* — Slater & Matsil, L.L.P.

(57) ABSTRACT

A semiconductor device includes a first capacitor comprising a plurality of first unit capacitors interconnected to each other, each having a first unit capacitance; and a second capacitor comprising a plurality of second unit capacitors interconnected to each other, each having a second unit capacitance, wherein the first unit capacitors and the second unit capacitors have equal numbers of unit capacitors. The first unit capacitors and the second unit capacitors are arranged in an array with rows and columns and placed in an alternating pattern in each row and each column. The first and the second unit capacitors each have a total number greater than two.

10 Claims, 7 Drawing Sheets

US 7,923,817 B2

CAPACITOR PAIRS WITH IMPROVED MISMATCH PERFORMANCE

This application is a divisional of U.S. patent application Ser. No. 11/591,644, filed Nov. 1, 2006 now U.S. Pat. Ser. No. 7,545,022, and entitled "Capacitor Pairs with Improved Mismatch Performance," which application is hereby incorporated herein by reference.

TECHNICAL FIELD

This invention relates generally to semiconductor devices, and more particularly to the design and manufacturing methods of capacitor pairs.

BACKGROUND

In modern integrated circuits, such as circuits for mixed-mode or radio-frequency applications, a pair of capacitors with equal capacitances is commonly used. The mismatched performance of the capacitor pair determines the accuracy of the resulting digital signal, and thus capacitor pairs with highly matched capacitances are preferred.

FIG. 1 illustrates a conventional capacitor pair, which includes a first capacitor C1 and a second capacitor C2. Capacitors C1 and C2 are identically designed. Each of the capacitors C1 and C2 include a first plurality of fingers and a second plurality of fingers alternately placed. The capacitances of capacitors C1 and C2 are partially determined by the length and number of fingers. Greater capacitors C1 and C2 can be designed by increasing the number of fingers and/or by increasing the length of the fingers.

The capacitor pair illustrated in FIG. 1 has drawbacks, however. Although capacitors C1 and C2 are designed to be identical, the formation processes are sensitive to local environments. For example, one of the capacitors C1 and C2 may be located close to a pattern-sparse region, and the other capacitor may be located close to a pattern-dense region. The different pattern densities cause pattern-loading effects, hence variations in dimensions. As a result, capacitors C1 and C2 mismatch from each other. Typically, process variations increase with the increase in capacitances of capacitors C1 and C2.

To solve the process sensitivity problem, a modified capacitor pair is provided, as is illustrated in FIG. 2. The modified capacitor pair includes four unit capacitors arranged as a two-by-two array, with two of the unit capacitors interconnected to form one capacitor. Each unit capacitor is cross-coupled to another unit capacitor. Such a layout helps reduce process sensitivity.

With the scaling of integrated circuits, new integrated circuit formation methods are used. Particularly, damascene processes are widely used in 0.18 µm technology and below, and thus are also used for the formation of capacitor pairs. Damascene processes typically involve forming dielectric layers; forming openings in the dielectric layers; filling the openings with copper or copper alloys; and planarizing the surface of the dielectric layer and copper using a chemical mechanical polish (CMP) process. Using a CMP process worsens the mismatch performance of capacitor pairs if the capacitor pairs have high capacitances. Accordingly, a new capacitor structure having high mismatch performance and methods for forming the same are needed.

SUMMARY OF THE INVENTION

In accordance with one aspect of the present invention, a semiconductor device includes a first capacitor comprising a plurality of first unit capacitors interconnected to each other, each having a first unit capacitance; and a second capacitor comprising a plurality of second unit capacitors interconnected to each other, each having a second unit capacitance, wherein the first unit capacitors and the second unit capacitors have equal numbers of unit capacitors. The first unit capacitors and the second unit capacitors are arranged in an array with rows and columns and placed in an alternate pattern in each row and each column. The first and the second unit capacitors each have a total number of greater than two.

In accordance with another aspect of the present invention, an integrated capacitor pair includes a capacitor array comprising a first plurality of unit capacitors and a second plurality of unit capacitors, wherein a total number of unit capacitors in the capacitor array is no less than six, and wherein the first and the second plurality of unit capacitors are placed in an alternating pattern in each row and each column. Each unit capacitor in the first plurality of unit capacitors includes a first common node comprising a first conductive bus and a plurality of first fingers connected to the first conductive bus; a plurality of second fingers, each being between and electrically insulated from two of the first fingers; and a second conductive bus interconnecting the plurality of second fingers. Each unit capacitor in the second plurality of unit capacitors includes a second common node comprising a third conductive bus and a plurality of third fingers connected to the third conductive bus; a plurality of fourth fingers, each being between and electrically insulated from two of the third fingers; and a fourth conductive bus interconnecting the plurality of fourth fingers. The first common nodes of the unit capacitors are interconnected. The second common nodes of the unit capacitors are interconnected. The second conductive buses of the unit capacitors are interconnected. The fourth conductive buses of the unit capacitors are interconnected.

In accordance with yet another aspect of the present invention, a semiconductor device includes a first capacitor comprising a first plurality of unit capacitors interconnected to each other, each having a first unit capacitance of less than about 200fF or a first unit area of less than about 200 um$^2$; a second capacitor comprising a second plurality of unit capacitors interconnected to each other, each having a second unit capacitance of less than about 200fF or a second unit area of less than about 200 um$^2$, wherein the first and the second plurality of unit capacitors have a same number of unit capacitors, and wherein the first and the second plurality of unit capacitors are interconnected through a common node. The first and the second plurality of unit capacitors are arranged as an array and are placed in an alternating pattern in each row and each column.

In accordance with yet another aspect of the present invention, a method for forming a semiconductor device includes forming a first plurality of unit capacitors and forming a second plurality of unit capacitors having a same number of unit capacitors as the first plurality of unit capacitors, wherein a total number of unit capacitors in the first and the second of plurality of unit capacitors is no less than six, and wherein the first and the second plurality of unit capacitors are arranged in an array and in an alternating pattern in each row and each column of the array. The method further includes interconnecting the first plurality of unit capacitors to form a first capacitor and interconnecting the second plurality of unit capacitors to form a second capacitor.

In accordance with yet another aspect of the present invention, a method for forming a semiconductor device includes providing a target capacitance value of a capacitor pair; determining a count for dividing the target capacitance value into unit capacitances so that each unit capacitance is less than about 200fF; forming a first plurality of unit capacitors each having the unit capacitance or an unit area of less than about 200 um$^2$, wherein a number of the first plurality of unit capacitors equals the count; forming a second plurality of unit capacitors having a same number of unit capacitors as the first plurality of unit capacitors, wherein the first and the second plurality of unit capacitors are arranged as an array and placed in an alternating pattern in each row and each column of the array; interconnecting the first plurality of unit capacitors to form a first capacitor; and interconnecting the second plurality of unit capacitors to form a second capacitor.

The embodiments of the present invention have the advantageous feature of lowered sensitivity to process variations. A greater capacitor pair can thus be formed without increasing relative capacitance mismatches.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
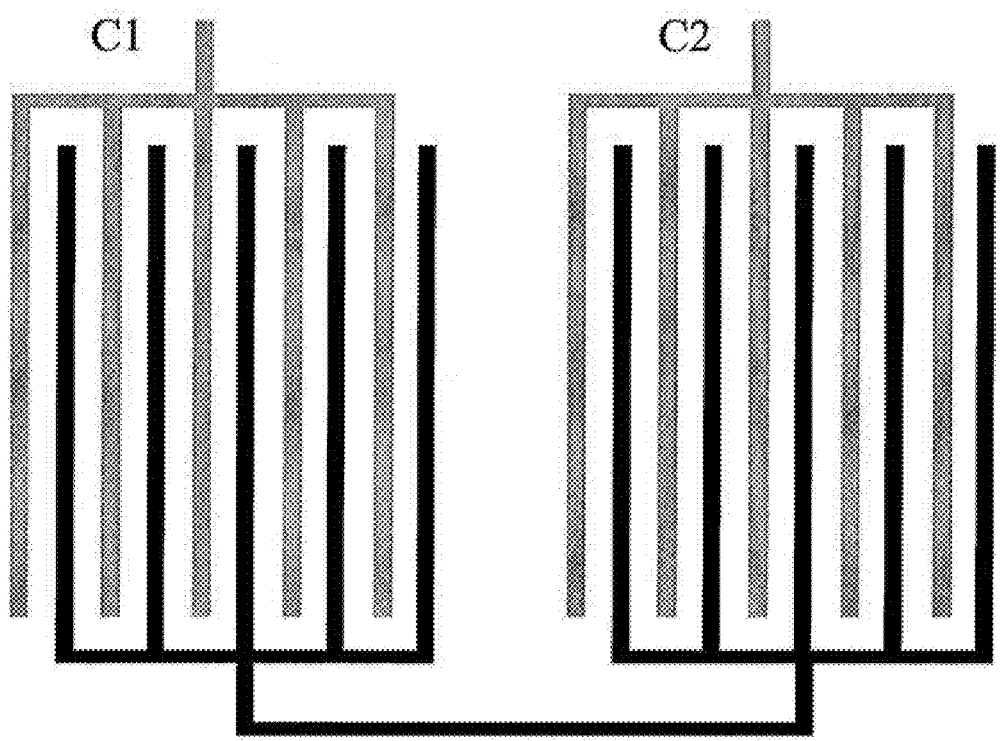
FIG. 1 illustrates a conventional capacitor pair, wherein each of the capacitors in the capacitor pair include a single capacitor.
Figure 2:
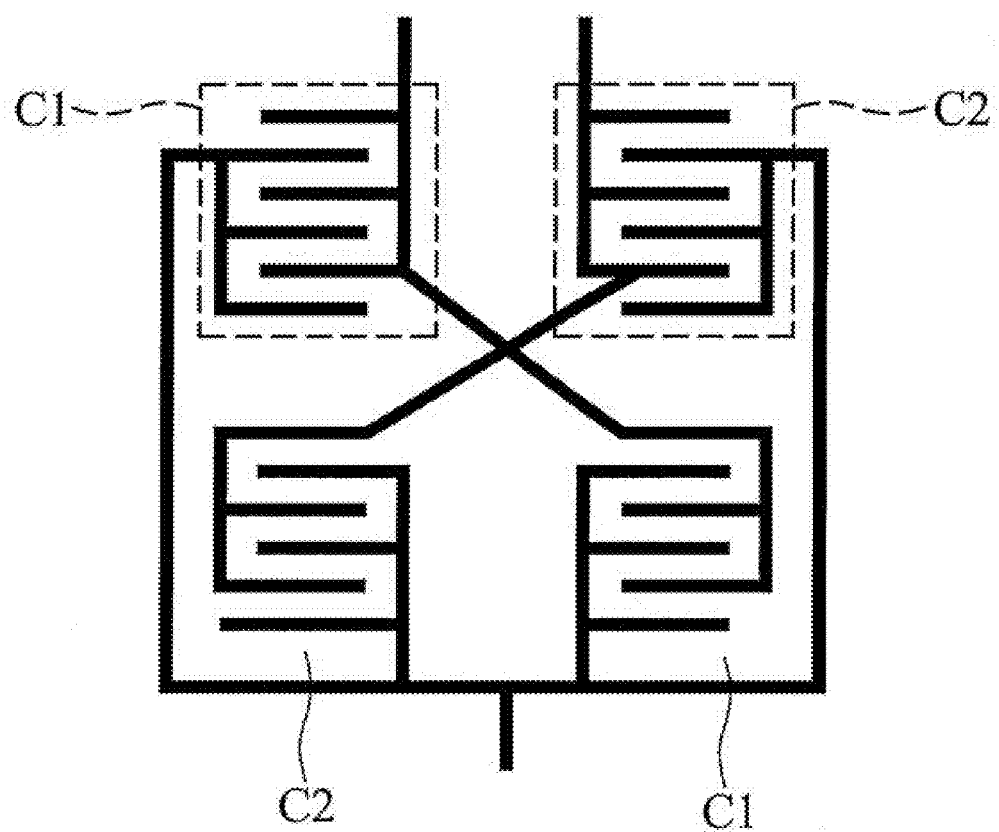
FIG. 2 illustrates a conventional capacitor pair, wherein two unit capacitors are interconnected to form one capacitor in the capacitor pair.
Figure 3:
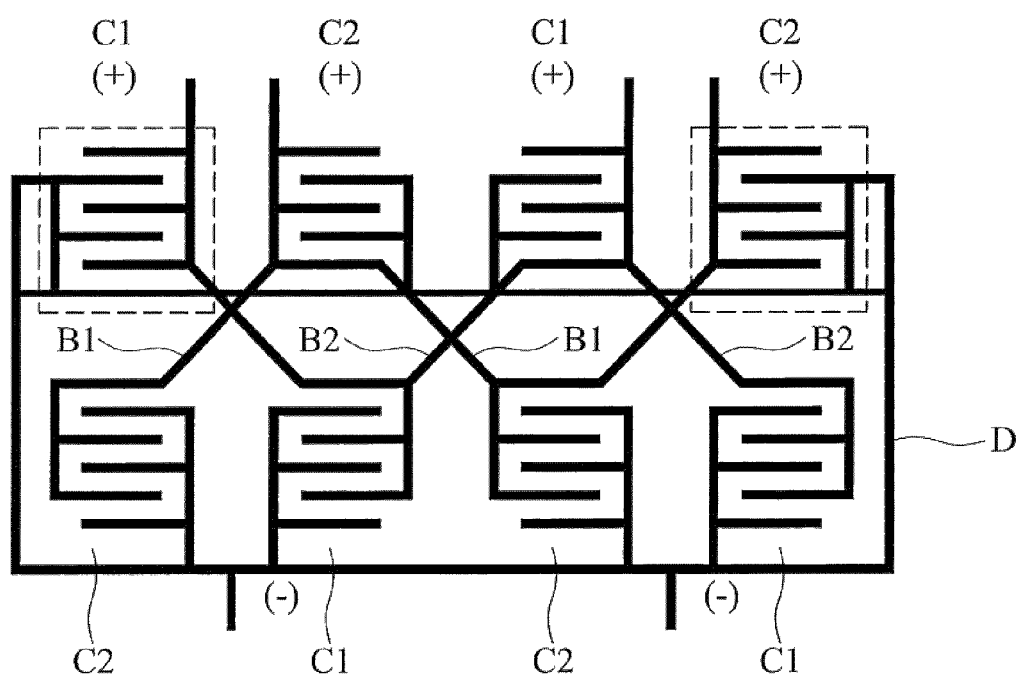
FIG. 3 illustrates a capacitor pair, wherein each of the capacitors in the capacitor pair include four interconnected unit capacitors.

FIG. 3 illustrates a top view of an embodiment of the present invention, which includes eight unit capacitors arranged as a two-by-four array. Four of the interconnected unit capacitors are marked as C1, and the other four interconnected unit capacitors are marked as C2. Unit capacitors C1 and C2 are designed to have identical capacitances. Unit capacitors C1 and unit capacitors C2 are placed in an alternating pattern, hence making a checkerboard pattern. Each unit capacitor comprises a first set of interconnected metal lines (referred to as fingers hereinafter) and a second set of interconnected fingers. The first and the second sets of fingers and the buses connecting the fingers are preferably metal lines formed in a metallization layer. As is known in the art, metal lines in metallization layers are preferably formed of copper or copper alloys, although other commonly used metallic materials, such as aluminum, tungsten, and combinations thereof, can also be used. In the preferred embodiment, the fingers and buses may be formed using damascene processes. Alternatively, they may be formed by depositing and patterning a metal layer. Neighboring fingers are electrically insulated, hence forming sub-capacitors. The capacitance of a unit capacitor is the sum of the capacitances of the sub-capacitors. In the illustrated embodiment shown in FIG. 3, all unit capacitors share a common node D. Unit capacitors C1 are interconnected to form one capacitor, and unit capacitors C2 are interconnected to form another capacitor. Throughout the description, a capacitance of a capacitor pair refers to a capacitance of the capacitor formed by interconnected unit capacitors C1 or C2.

Figure 4:
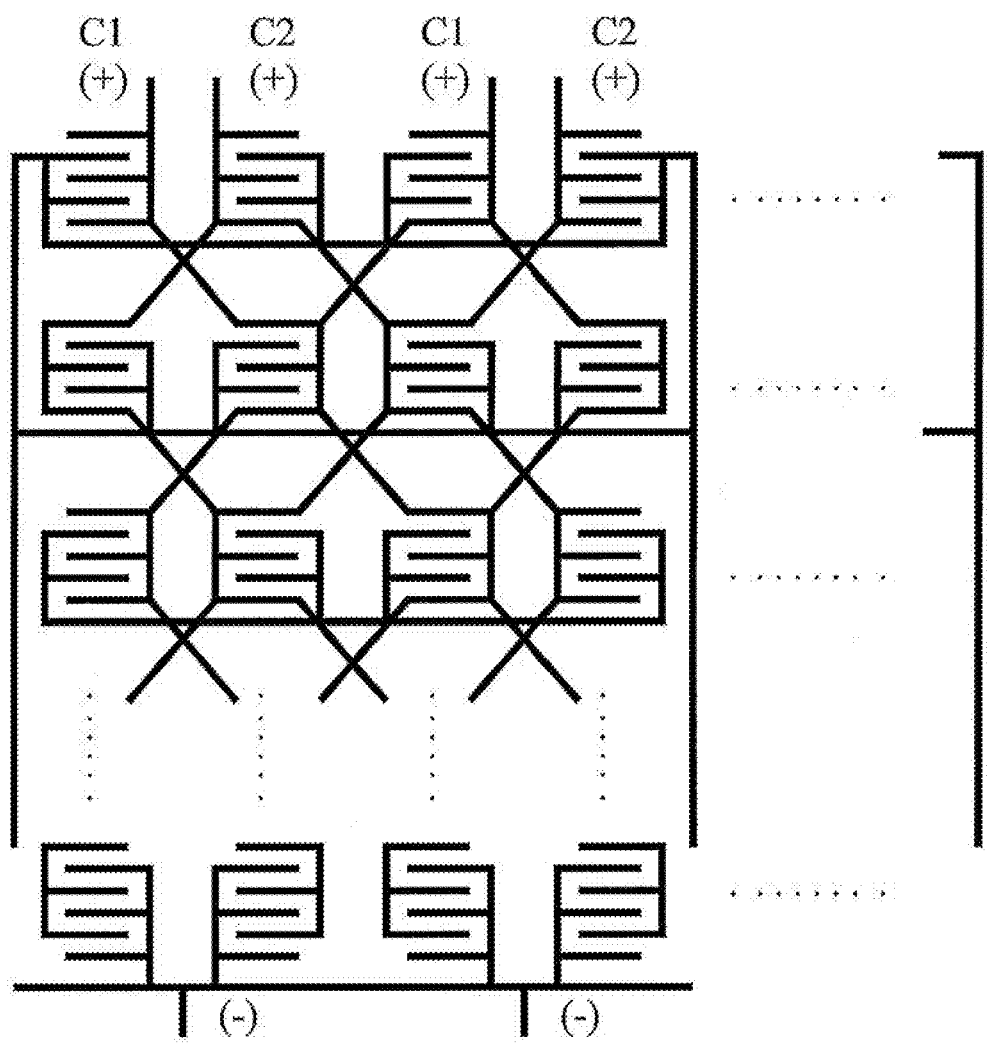
FIG. 4 illustrates an expandable capacitor pair.

FIG. 4 schematically illustrates an expandable array for forming capacitor pairs. In the preferred embodiment, in each row and each column of the array, unit capacitors C1 and C2 are arranged alternately. It should be appreciated that a capacitor pair of the present invention may comprise any array having four, and preferably six or more, unit capacitors. The number of rows and the number of columns may differ. The array may also include only a single row or a single column. Compared to conventional methods for forming capacitor pairs, when greater capacitances are needed, instead of increasing capacitances, the row number and/or column number of the array is increased. It can be found that if the row number and the column number are both even numbers, the centroid of the capacitor formed of unit capacitors C1 and the centroid of the capacitor formed of unit capacitors C2 will overlap.

Although unit capacitors C1 and C2 preferably have same unit capacitances, the unit capacitance of unit capacitors C1 may be different from the unit capacitance of unit capacitors C2, although such a scheme is more prone to process variations.

An advantageous feature of the embodiments of the present invention is that the process variations, such as the variations caused by pattern density differences, may be at least reduced and possibly substantially eliminated. For example, if a unit capacitor C1 has a greater capacitance than other unit capacitors due to a higher or a lower pattern density, neighboring unit capacitors C2 will likely have greater capacitances also, which will at least partially cancel the capacitor mismatch caused by the increase in the capacitance of capacitor C1.

Figure 5:
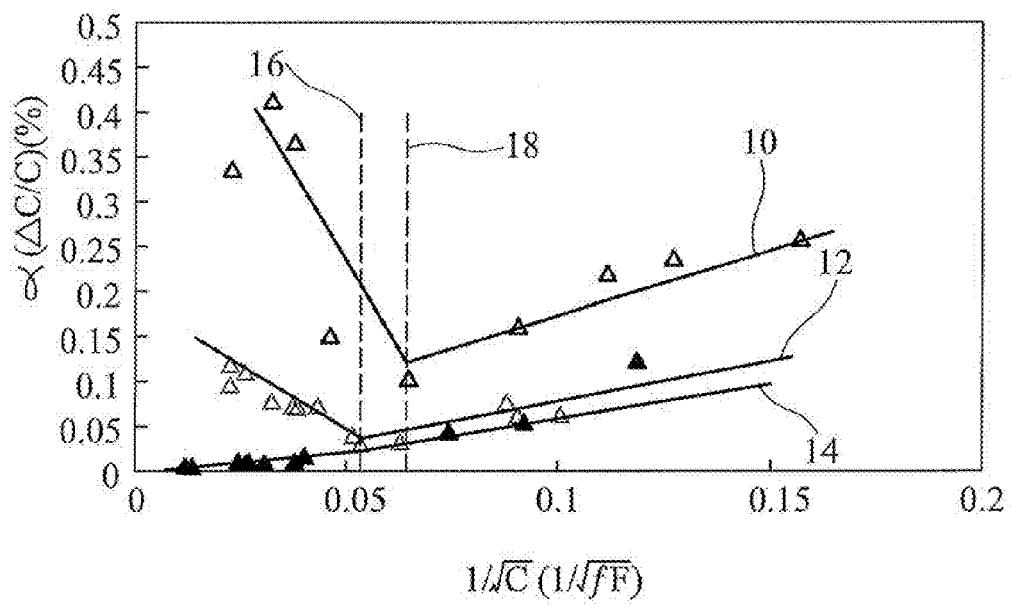
FIG. 5 illustrates capacitance mismatch of capacitor pairs as a function of capacitances.

FIG. 5 illustrates capacitance mismatch of capacitor pairs as a function of capacitances. The X-axis represents inversed values of the square roots of capacitances, wherein the capacitances are the total capacitances of all interconnected unit capacitors. The Y-axis represents average values of relative capacitance mismatches, wherein the average values are obtained by averaging a plurality of capacitor pairs on a wafer. From line 10 to line 12 and to line 14, a same capacitance is divided into increasingly smaller capacitances for unit capacitors. Line 10 is obtained from a capacitor pair consisting of only two capacitors. Line 12 is obtained from a capacitor pair consisting of four cross-coupled unit capacitors. Line 14 is obtained from a capacitor pair consisting of an even greater number of cross-coupled unit capacitors arranged as arrays. Comparing portions of lines 10, 12 and 14 on the left side of a dotted line 16, it is found that for lines 10 and 12, which include relatively bigger unit capacitors, capacitance mismatches increase with the increase in capacitances. However, when the same capacitance is divided into smaller unit capacitors (refer to line 14), the capacitance mismatches decrease with the increase in the capacitance, hence the increase in the number of unit capacitors. This is possibly due to the fact that with the increase in the number of unit capacitors, process variations are canceled among unit capacitors.

On the right side of the dotted line 18, the capacitance mismatches for lines 10, 12 and 14 all increase. The trend change of lines 10, 12 and 14 occurs in a region roughly between lines 16 and 18, in which the corresponding capacitances are about 400fF.

Line 14 indicates that the embodiments of the present invention are particularly useful for the formation of capacitor pairs with great capacitances. In the examples shown in FIG. 5, it is found that if a total capacitance is about 400fF, the capacitance mismatches may be significantly reduced by using the embodiments of the present invention. If the total capacitance is less than about 400fF, using the embodiments of the present invention is still beneficial for reducing capacitance mismatches, although with smaller effects. It should be appreciated that the turning point 400fF is only an example, and the actual turning point is related accordingly to various factors, such as the technology used for forming capacitors, materials, and the like. One skilled in the art will be able to find the turning points through routine experiments.

From line 12, it is noted that when the capacitance is greater than about 400fF, the capacitance mismatch still increases with the increase in capacitance. This means that the capacitors in the capacitor pair need to be further divided until at the point where the increase in total capacitance no longer causes the increase in capacitance mismatch. Since for line 12, each capacitor in the capacitor pair includes two unit capacitors, each unit capacitor has a capacitance of about 200fF. Accordingly, the capacitance of unit capacitors is preferably less than about 200fF. More preferably, the number of unit capacitors C1 or C2 is equal to or greater than three, hence the unit capacitance is preferably less than about 130fF.

Figure 6:
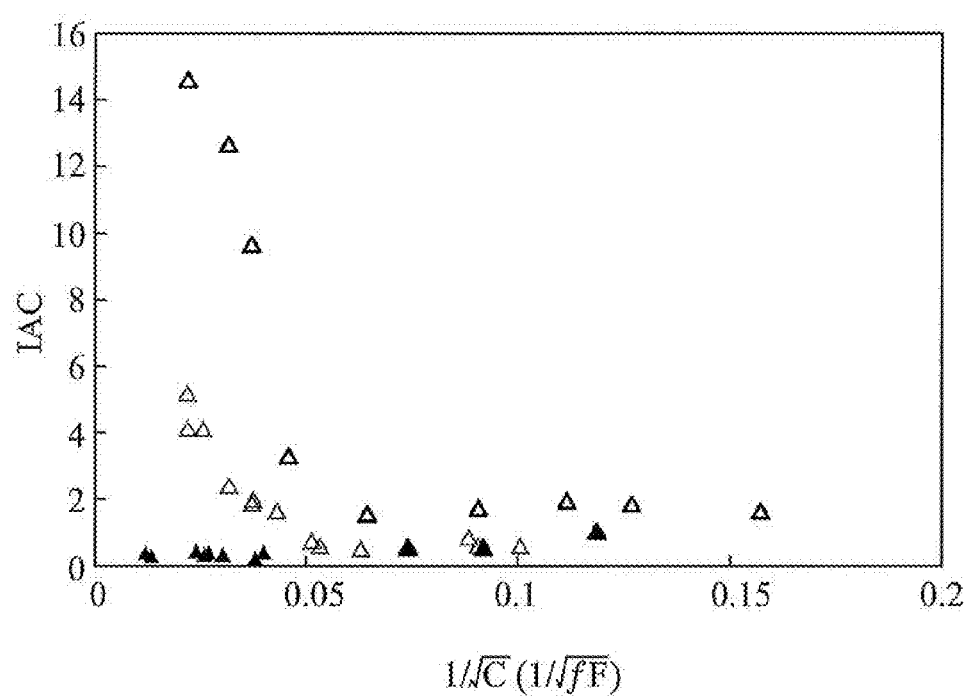
FIG. 6 illustrates normalized capacitance mismatches as a function of capacitances.

FIG. 6 illustrates normalized capacitance mismatches as a function of capacitances. The Y values represent individual average capacitance mismatches (IAC), which are obtained by dividing the Y values of the points shown in FIG. 5 by the corresponding X values. The same trends as shown in FIG. 5 have been observed.

Figure 7:
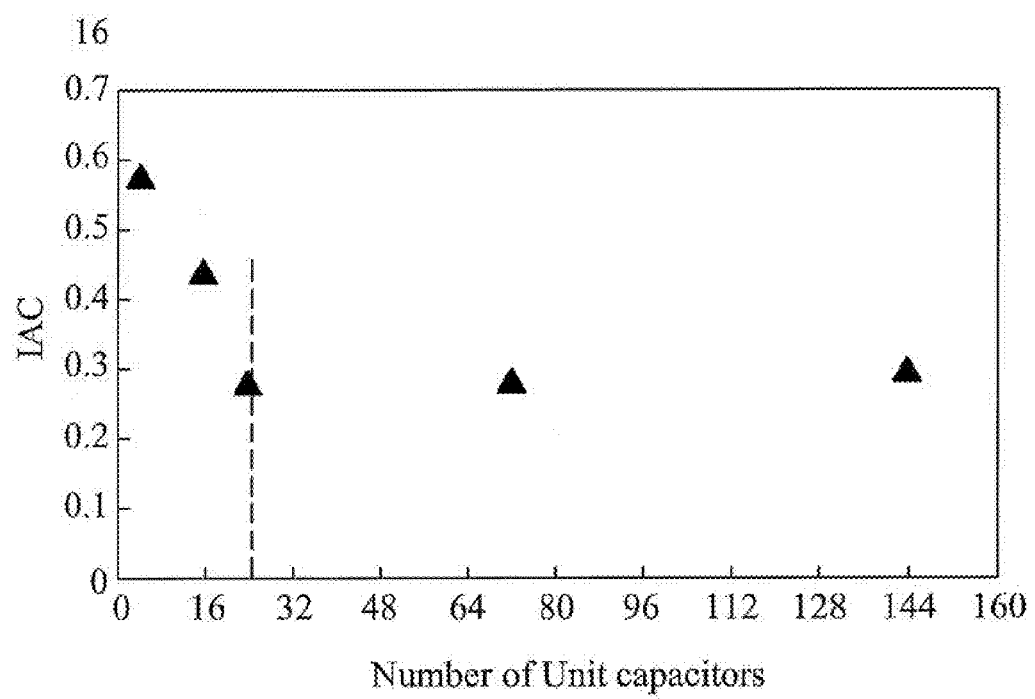
FIG. 7 illustrates normalized capacitance mismatches as a function of numbers of unit capacitors in capacitor pairs.

Although separating capacitor pairs with great capacitances into more unit capacitors generally improves the mismatch performance, an optimum number of unit capacitors for dividing a big capacitor can be found. FIG. 7 illustrates data that can be used for determining the optimum number of unit capacitors. The data are obtained by forming sample capacitor pairs, which have a capacitance of about 4.5 pF, with different numbers of unit capacitors, and the individual average capacitance mismatches IAC are calculated based on the measured capacitance values of the capacitor pairs. It is found that in the illustrated example, IAC decreases when the capacitor pairs are divided into increasingly greater numbers of unit capacitors when the numbers of unit capacitors are relatively small. IAC, however, saturates when the number of unit capacitors reaches a certain value. In the example illustrated in FIG. 7, IAC saturates when the number of unit capacitors reaches about 24. Therefore, the optimum number of unit capacitors is about 24. Again, it should be realized that the saturation number is related to various factors, such as the technology and materials used for forming the capacitors. One skilled in the art will be able to find the optimum number of unit capacitors through routine experiments.

In FIG. 7, IAC is used as the criteria for determining the optimum number of unit capacitors. In other embodiments, other commonly used statistical data can also be used. For example, standard deviation of capacitance mismatches can be illustrated as a function of numbers of unit capacitors, and the saturation point can be determined accordingly.

Preferably, the capacitors discussed in the preceding paragraphs are implemented as metal-oxide-metal (MOM) capacitors. An exemplary embodiment for forming the MOM capacitors is explained using FIG. 3, which is a top view of a metallization layer used for forming interconnect structures. Each unit capacitor includes a plurality of metal lines (fingers), wherein neighboring fingers are closely located and electrically insulated from each other. Capacitances are formed between the neighboring fingers. The connecting buses B1 and B2 for connecting the fingers and unit cells may be formed in the same metallization layer as the fingers. Alternatively, connecting buses B1 and B2 may be formed in different metallization layers from the fingers, and are connected to the respective fingers through vias.

Figure 8:
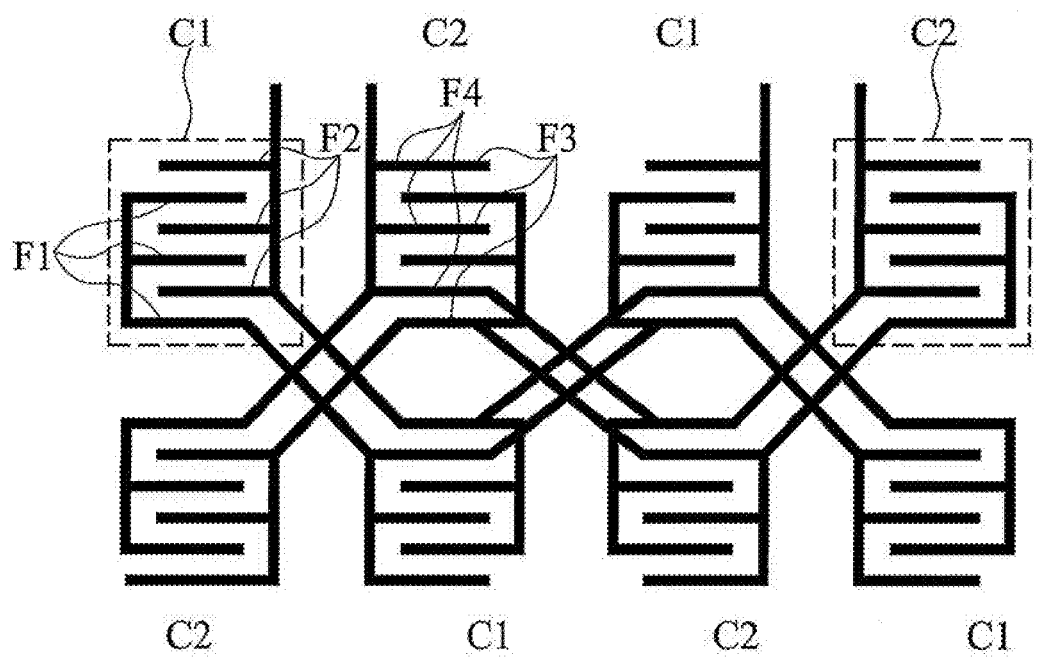
FIG. 8 illustrates a capacitor pair, wherein the two capacitors in the capacitor pair have no common node.

In the previously illustrated embodiment, the two capacitors in a capacitor pair share a common node (refer to Node D in FIG. 3), such that less chip area is required. In alternative embodiments, unit capacitors C1 and C2 are electrically separated from each other with no common nodes, and an exemplary embodiment is illustrated in FIG. 8. Each unit capacitor C1 includes a plurality of fingers F1 and a plurality of fingers F2. Each unit capacitor C2 includes a plurality of fingers F3 and a plurality of fingers F4. Each of capacitor plates F1, F2, F3 and F4 is connected to other fingers marked with a same number in the array.

Although in the previously discussed embodiments, unit capacitors are formed in one metallization layer, they can be spread to several metallization layers and interconnected with vias. For example, in a metallization layer, a first capacitor pair as illustrated in FIG. 3 is formed. In another metallization layer, a second capacitor pair, which may have greater, lesser or equal row numbers and/or column numbers than the array illustrated in FIG. 3, is formed, and the first and the second unit capacitor arrays are parallel interconnected to form a greater capacitor pair. Alternatively, the first capacitor pair and the second capacitor pair can be formed in a same metallization layer and parallel interconnected.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first capacitor comprising a plurality of first unit capacitors interconnected to each other, each having a first unit capacitance;
   a second capacitor comprising a plurality of second unit capacitors interconnected to each other, each having a second unit capacitance, wherein the plurality of first unit capacitors and the plurality of second unit capacitors have equal numbers of unit capacitors, and are arranged in an array with rows and columns placed in an alternating pattern in each row and each column of the array, and wherein a total number of the first unit capacitors is greater than two, and a total number of the second unit capacitors is greater than two; and a common node connected to the first unit capacitors and the second unit capacitors.

2. The semiconductor device of claim 1, wherein the first and the second unit capacitances are each less than about 200fF.

3. The semiconductor device of claim 1, wherein the first and the second unit capacitors each have an area of less than about 200 $\mu m^2$.

4. The semiconductor device of claim 1, wherein the first and the second unit capacitors have a common centroid.

5. The semiconductor device of claim 1, wherein the first unit capacitance equals the second unit capacitance.

6. The semiconductor device of claim 1, wherein the first unit capacitance is different from the second unit capacitance.

7. A semiconductor device comprising:
a first capacitor comprising a first plurality of unit capacitors interconnected to each other, each having a first unit capacitance of less than about 200fF or a first unit area of less than about 200 um$^2$;
a second capacitor comprising a second plurality of unit capacitors interconnected to each other, each having a second unit capacitance of less than about 200fF or a second unit area of less than about 200 um$^2$, wherein the first and the second pluralities of unit capacitors have a same number of unit capacitors, and wherein the first and the second pluralities of unit capacitors are arranged as an array and are placed in an alternating pattern in each row and each column of the array; and
a common node interconnecting the first plurality of unit capacitors to the second plurality of unit capacitors.

8. The semiconductor device of claim 7, wherein the first and the second pluralities of unit capacitors each have a unit capacitance of less than about 200fF and a unit area of less than about 200 um$^2$.

9. The semiconductor device of claim 7, wherein the first unit capacitance equals the second unit capacitance.

10. The semiconductor device of claim 7, wherein the first unit capacitance is different from the second unit capacitance.

* * * * *